(12) United States Patent
Hung et al.

(10) Patent No.: US 8,872,301 B2
(45) Date of Patent: Oct. 28, 2014

(54) DUAL PROFILE SHALLOW TRENCH ISOLATION APPARATUS AND SYSTEM

(75) Inventors: Chia-Yang Hung, Kaohsiung (TW); Po-Zen Chen, Tainan (TW); Szu-Hung Yang, Tainan (TW); Chih-Cherng Jeng, Madou Township (TW); Chih-Kang Chao, Tainan (TW); I-I Cheng, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/454,924

(22) Filed: Apr. 24, 2012

(65) Prior Publication Data

US 2013/0277790 A1    Oct. 24, 2013

(51) Int. Cl.
*H01L 31/18*    (2006.01)
*H01L 21/311*   (2006.01)
*H01L 21/66*    (2006.01)
*H01L 23/48*    (2006.01)
*H01L 21/762*   (2006.01)
*H01L 21/02*    (2006.01)
*H01L 21/8238*  (2006.01)
*H01L 21/76*    (2006.01)

(52) U.S. Cl.
USPC ............. 257/461; 257/48; 257/432; 257/460; 257/700; 257/741; 438/70; 438/197; 438/700; 438/710; 438/89

(58) Field of Classification Search
USPC ................... 257/461, 460, 48, 432, 700, 741; 438/70, 197, 700, 710
See application file for complete search history.

(56) References Cited

U.S. PATENT DOCUMENTS

| 6,358,849 | B1 * | 3/2002 | Havemann et al. | 438/689 |
|---|---|---|---|---|
| 2002/0066916 | A1 | 6/2002 | Hsu et al. | |
| 2002/0110968 | A1 * | 8/2002 | Kim | 438/197 |
| 2007/0262367 | A1 * | 11/2007 | Koizumi | 257/292 |
| 2009/0212337 | A1 | 8/2009 | Murakoshi et al. | |
| 2010/0163932 | A1 * | 7/2010 | Jun | 257/225 |
| 2010/0252870 | A1 * | 10/2010 | Lin et al. | 257/291 |
| 2011/0045629 | A1 * | 2/2011 | Ohkawa | 438/87 |
| 2011/0156196 | A1 * | 6/2011 | Koizumi | 257/443 |
| 2011/0164159 | A1 * | 7/2011 | Ohgishi | 348/298 |
| 2011/0260280 | A1 * | 10/2011 | Chuang et al. | 257/460 |
| 2011/0272774 | A1 * | 11/2011 | Itagaki | 257/437 |
| 2013/0071977 | A1 * | 3/2013 | Scheiper et al. | 438/299 |
| 2013/0175661 | A1 * | 7/2013 | Cai et al. | 257/506 |
| 2013/0189826 | A1 * | 7/2013 | Ervin et al. | 438/424 |

FOREIGN PATENT DOCUMENTS

| JP | 2006041397 A | 2/2006 |
|---|---|---|
| JP | 2011-176334 | 9/2011 |
| KR | 100441700 B1 | 7/2004 |

\* cited by examiner

*Primary Examiner* — Shaun Campbell
*Assistant Examiner* — Thai T Vuong
(74) *Attorney, Agent, or Firm* — Slater & Matsil, L.L.P.

(57) ABSTRACT

The presented principles describe an apparatus and method of making the same, the apparatus being a semiconductor circuit device, having shallow trench isolation features bounding an active area and a periphery area on a semiconductor substrate to electrically isolate structures in the active area from structures in the periphery area. The shallow trench isolation feature bounding the active area is shallower than the shallow trench isolation feature bounding the periphery area, with the periphery area shallow trench isolation structure being formed through two or more etching steps.

20 Claims, 5 Drawing Sheets

DUAL PROFILE SHALLOW TRENCH ISOLATION APPARATUS AND SYSTEM

BACKGROUND

Complimentary metal oxide semiconductors (CMOS) diodes are commonly used for sensing images in cameras and other video or photo devices. Recently, CMOS devices have been improved by using backside illumination (BSI). Generally, photolithography processes deposit CMOS structures on the top side of silicon wafer or other substrate. Early CMOS devices gathered light from the top, the same side where the CMOS structure was applied. Metal interconnects deposited on the top surface of the CMOS substrate can block portions of the photosensitive CMOS structure, degrading the picture quality and individual CMOS sensitivity. BSI is the collection of light from the backside of the CMOS substrate, with the CMOS Sensor deposited onto the top side of the substrate, and then the substrate abraded or otherwise thinned to allow light to pass though the substrate and affect the photosensitive region of the CMOS device. Ideally the substrate thickness is reduced so that light may enter the backside of the CMOS device and strike the photosensitive region of the CMOS, eliminating obstruction and interference during image capture from deposited structures and metal interconnects.

Shallow trench isolation (STI) is a technique used in CMOS image sensor circuit devices to isolate structures and regions. A physical trench may be etched around the CMOS structure into the substrate to provide physical separation of the CMOS structure from adjacent structures. Additionally, the STI trench may be filled with an oxide such as silicon dioxide (SiO2). Structures in the periphery, such as row select transistors, reset transistors, or the like, may also have STI trenches etched into the substrate to isolate them from the active photosensitive CMOS structure. STI permits CMOS sensors to operate more accurately, preventing spurious electrons from striking the CMOS photosensitive region and simulating a photon being detected. The STI trench assists in preventing spurious electrons from affecting the CMOS sensor by eliminating a straight line path between the CMOS sensor and any other structures.

BRIEF DESCRIPTION OF THE DRAWINGS

A further understanding of the present principles can be obtained by reference to embodiments set forth in the accompanying drawing where like reference numbers indicate like element throughout the drawings. The drawings are not intended to limit the scope of the present principles, which are set forth with particularity in the claims, but to clarify and exemplify the principles presented herein. Reference is now made to the following figures:

DETAILED DESCRIPTION

The present principles are directed to an apparatus, and system for making an apparatus, having reduced Dark Current characteristics and a dual profile STI. In particularly useful embodiments, a semiconductor circuit device has a pixel area with one or more CMOS photodiode sensors isolated from the remainder of the periphery area. The periphery area may have other integrated circuit structures, and particularly control transistors, which may interfere with the operation or sensitivity of the photodiode. Alternatively, the presented principles may be used to isolate any active fabricated semiconductor region from adjacent periphery regions while reducing physical damage to the materials or structures in the active area.

Figure 1:
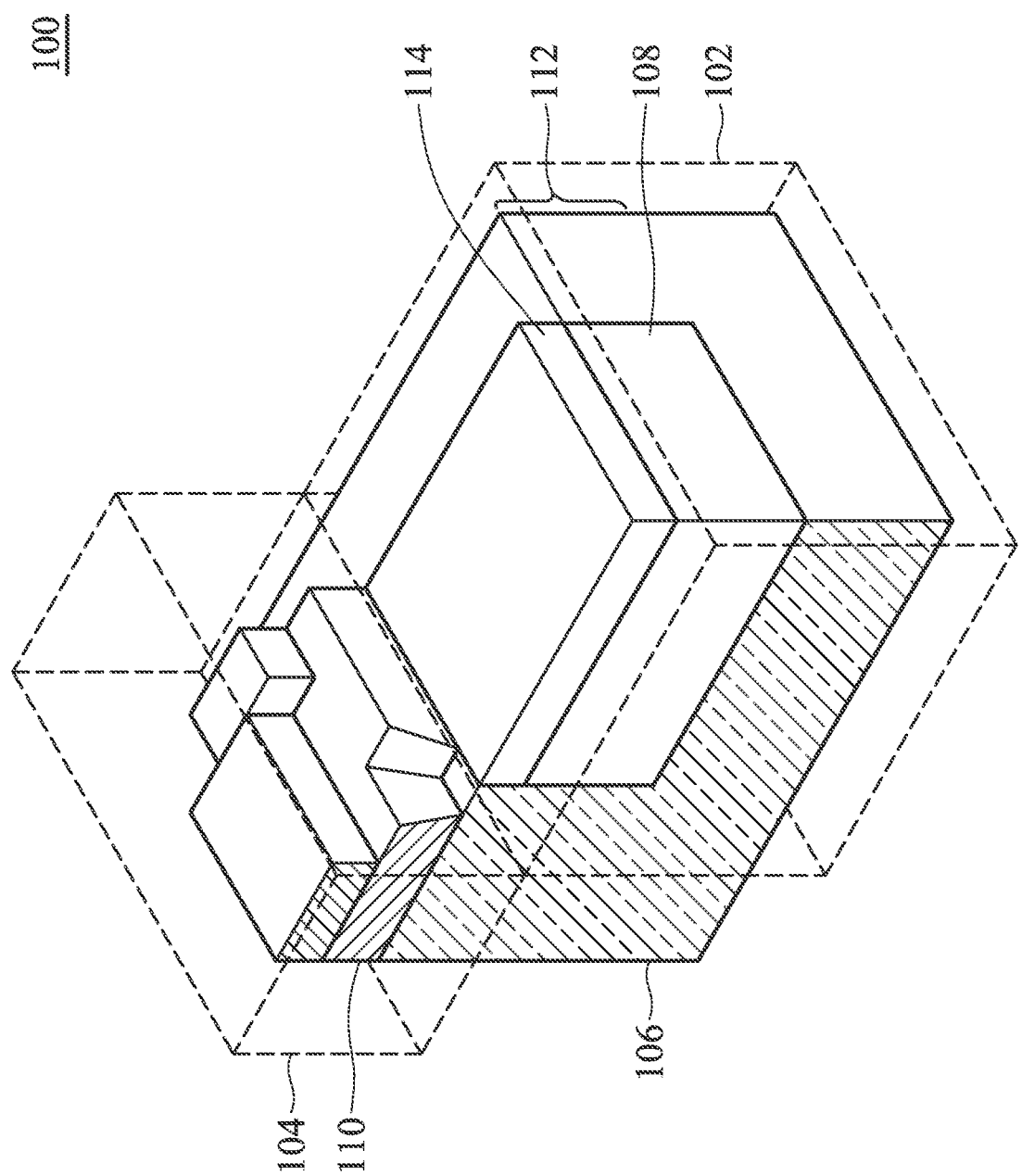
FIG. 1 is a diagram illustrating a cutaway view of a portion of a CMOS image sensing structure.

Referring now to FIG. 1, a diagram depicting an image sensing element 100 is shown. The image sensing element comprises, inter alia, an active area or pixel area 102 and a periphery area 104. The pixel area 102 generally includes the active photosensitive elements, such as a photodiode 112. Alternatively, in a non-photosensitive application, the pixel area may be an active area having devices that will be isolated.

The photodiode 112 itself is constructed on a silicon substrate 106 and may be a P-N junction diode, with an n+ region 114 deposited over a potential well 108 used to collect charge during the photodiode 112 exposure. Generally, in a CMOS photodiode array, the n+ region is the photosensitive region, permitting absorbed photons to promote electrons from the photodiode's 102 valence band to its conduction band. The promoted electrons are then held in the potential well 108 until the photodiode is read by a control transistor.

Skilled artisans will recognize that, while the present principles are described as being applied to a silicon substrate 106, any suitable semiconductor material may be advantageously employed, including, but not limited to gallium, GaAs, Indium Tin Oxide, ZnO, the like. Furthermore, the dual profile STI apparatus and methods described herein are not limited to a photodiode, or any particular type of photodiode, and may be used to advantageously isolate any type of device. Additionally, while dual profile STI etching is described herein as providing an STI trench around a single element in the pixel area or the periphery, any number of elements may be bounded by a single STI trench or combination of STI trenches.

The periphery 104 may include support devices or control transistors 110 such as a row select transistor, a reset transistor or the like. Such control transistors may be used to manage, address or control the access to each photodiode, or a group of photodiodes.

Figure 2:
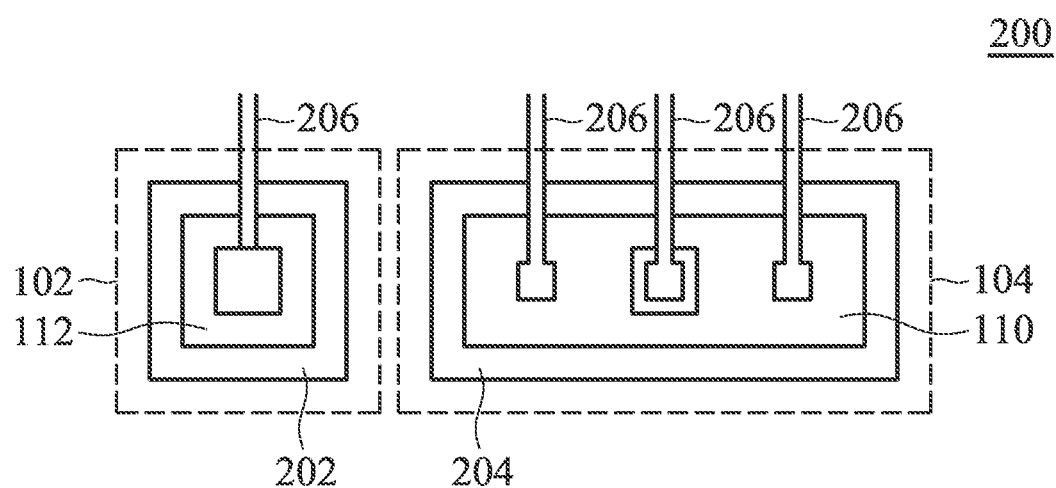
FIG. 2 is a diagram illustrating a top view of a portion of a CMOS image sensing structure.

Referring now to FIG. 2, a top view of an image sensing element 200 is shown. The image sensing element 200 has a photodiode 112 and control transistor 110, each of which has shallow trench isolation (STI) features to isolate the pixel area 102 from the periphery 104. The standard pixel area STI trench 202 isolates the pixel area 102 from the adjacent periphery 104 structures. Additionally, the periphery 104 has a periphery STI trench 204 bounding the periphery area 104 structures, and isolating those structures from the pixel area 102 and any other adjacent structures, including neighboring image sensing elements. Metal traces or interconnects 206 for accessing the photodiode 112 or control transistor 110 may be deposited after the STI trenches are etched to prevent the STI trench etch from damaging the interconnects 206 or the interconnects 206 from interfering with the STI etch.

Figure 3:
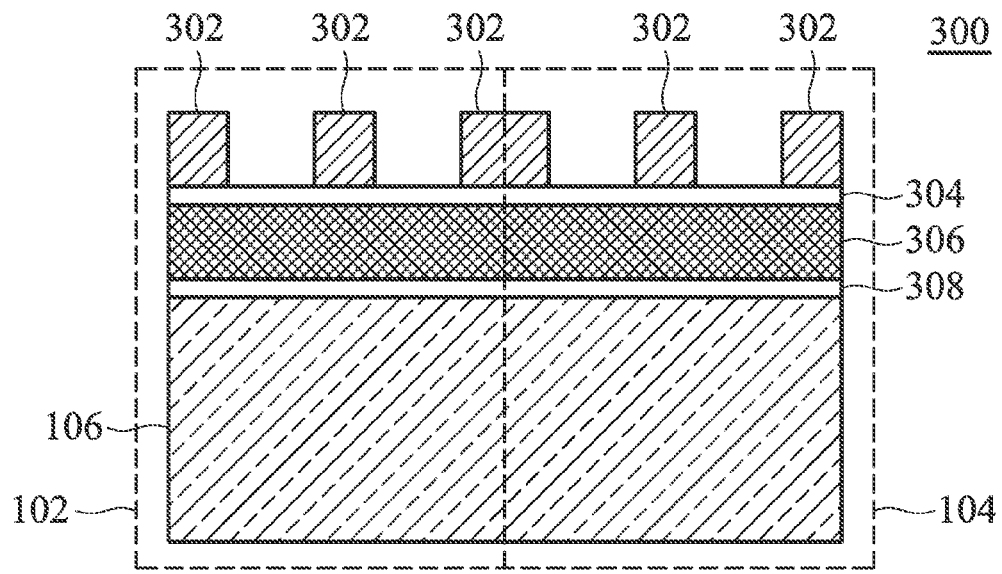
FIGS. 3-7 are cross-sectional views of a target structure illustrating steps in forming a dual profile STI.

Referring now to FIG. 3, a cutaway view of a target structure illustrates the first step 300 in one useful embodiment of a method for creating a dual profile STI structure. In this step 300, a silicon substrate 106 has a pixel area 102 and a periphery area 104. A native oxide layer 308 frequently forms on the silicon substrate 106, and a hard mask, such as a nitride layer 306 may be deposited on top of the native oxide layer 308. A plasma enhanced chemical vapor deposition (PE or PE-CVD) oxide layer 304 may be deposited on the nitride layer 306 to form a two layer hard mask. A typical thickness for the nitride layer 306 is approximately 800 angstroms, and approximately 90 angstroms for a PE oxide layer. While the nitride layer 306 and PE oxide layer 304 thicknesses are described herein as typical, any thickness of surface layer or hard mask may be used without deviating from the spirit and scope of the principles presented herein. Additionally, skilled artisans will recognize that surface preparation of the silicon substrate 106, via, for example, mechanical, chemical, or chemo-mechanical, or any other means, may eliminate the native oxide layer 308, or may be necessary for preparation of the substrate 106 or nitride layer 306 for deposition of subsequent layers.

A photoresist 302 is deposited onto the target structure, masked, exposed and washed to leave a mask delineating the desired STI trench profiles. Masking both the pixel area 102 and the periphery 104 advantageously permits an operator to perform the mask deposition with one step, however, any method for resist 302 patterning, including a multi-step process, may be employed.

Figure 4:
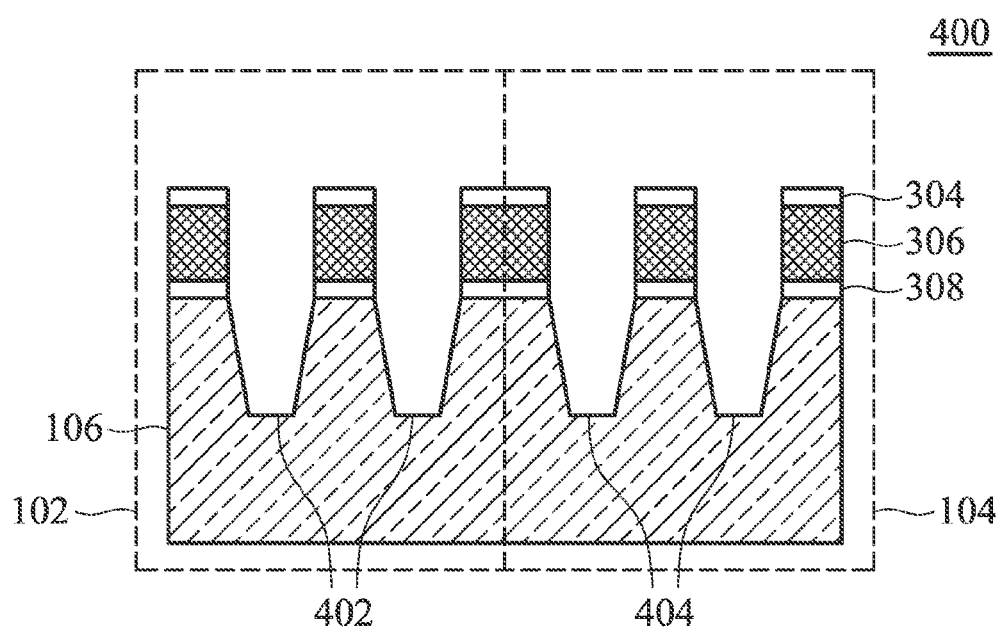

FIG. 4 illustrates the step of performing a first STI etch 400. In one embodiment of this step, plasma etching may be used to form the STI trenches. Alternatively, any other suitable etching process may be used to etch the STI trenches. Such process may include, but is not limited to, wet chemical etching, ion milling/sputter etching, reactive ion etching, or the like. In the first STI etching step 400, the initial photoresist 302 is also removed and any polymers created by the plasma removal of material may be washed off using a wet dip process. Any PE oxide layer 304 may also be removed during this step 400.

Damage to the silicon substrate 106 during a plasma etch is a well known phenomenon. The presented principles are directed to limiting the damage done during the plasma etch of STI trenches. Such plasma damage can cause Dark Current and White Pixel distortion in photodiode 112 operation by altering the structure of the silicon in the photodiode 112. In photodiodes, silicon damage may cause the photodiode 112 to improperly promote spurious electrons not associated with photoreactivity. Such spurious electrons cause a photodiode to register a light reading, even when no light has caused the promotion of an electron. Thus, silicon damage can cause inaccuracies in a photodiode's sensing of light by inaccurately reflecting the actual amount of light sensed by the photodiode, introducing noise into an image. Dark Current is current generated without light, while a white pixel defect is damage to, or overloading of a photodiode by excess Dark Current, causing the photodiode to always read as if it had sensed a pure white light, when it had not.

STI trenching is also used to isolate individual circuit elements, or groups of elements, to prevent interference from adjacent circuit elements. Generally, a standard depth for an STI trench is approximately 2300-2600 angstroms, and may advantageously be 2400-2500 angstroms. However, in this first STI etching step 400, plasma damage associated with etching an STI trench can be reduced by etching a shallower pixel area STI trench 402, and deepening the periphery trench 404 in a later step. Generally, the damage from a standard depth pixel area trench 402 of 2400-2500 angstroms results in a Dark Current of 11.6 electrons per second. A pixel area trench 402 that is substantially shallower than the periphery area trench results in less dark current due to the reduced plasma exposure damage associated with forming the shallower pixel area trench 402.

A pixel area trench 402 at a depth of 1400-1600 angstroms may be advantageously employed in particularly useful embodiments. Such a 1400-1600 angstrom pixel area STI trench 402 depth combined with a standard depth (2400-2500 angstroms) STI trench 404 provides adequate isolation, while reducing Dark Current to an average of 7.5 electrons per second. Alternatively, the depth of the pixel area trench 402 may be varied to suit the geometry or materials of the device. While a desirable ratio of second trench depth to first trench depth can be obtained through routine experimentation once informed by the present disclosure, it is believed that a ratio of at least about 140% (depth of trench 404 relative to trench 402) provides for good performance. Additionally, a pixel area trench 402 depth of about 1500 angstroms and a periphery area trench 404 depth of about 2500 angstroms will result in a useful and preferable trench depth ratio of about 5:3, or 167%.

In one useful embodiment, a pixel area trench 402 with a depth of 0.14-0.15 micrometers (1400-1500 angstroms) may be etched in a 70 micrometer (700,000 angstrom) thick substrate 106, resulting in a wafer thickness/STI depth ratio of about 1400:3, or 46,666%. Similarly, in additional embodiments, a periphery area trench 404 depth of 0.24-0.25 micrometers (2400-2500 angstroms) may be etched in a 70 micrometer thick substrate, resulting in a wafer thickness/STI depth ratio of about 280:1, or 28,000%. Skilled practitioners will recognize that the useful ratios of wafer thickness to trench depths may depend on one or more of many factors including, but not limited to, feature density, wafer thickness or material, desired performance characteristics or the like. Therefore, the ratios of trench depths to wafer thickness or the ratio of depths between the two trenches described herein is meant to be illustrative and not limiting.

Figure 5:
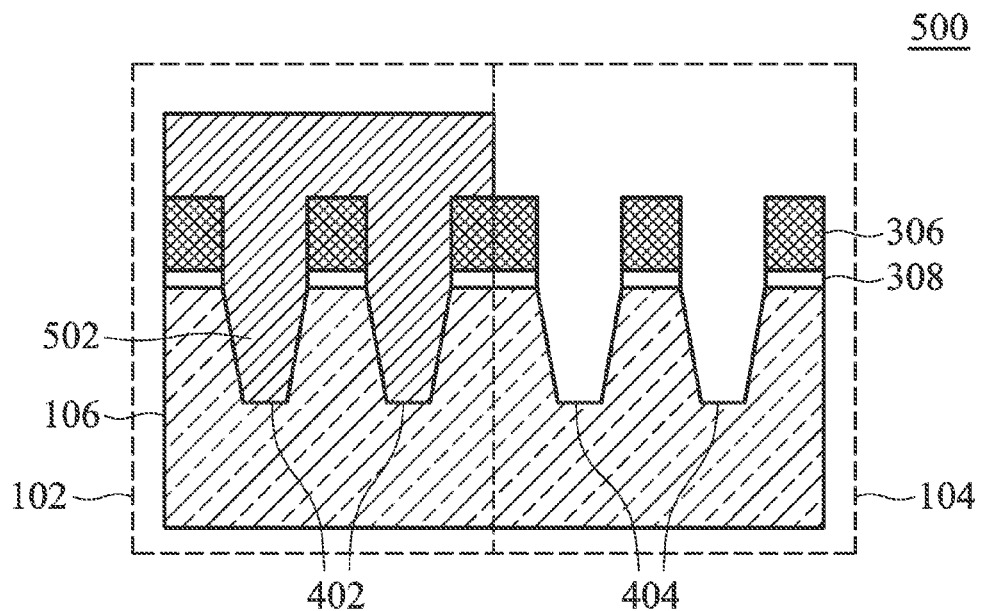

FIG. 5 illustrates a step for preparing a target structure 500 for a second etch to deepen the periphery area STI trench 404 to a standard depth. A second STI mask may be used to deposit a second photoresist 502 to cover the pixel area 102 such that the pixel area 102 and pixel area STI trench 402 is protected from any plasma or chemical etching used to deepen the periphery area STI trench 404. As the nitride layer 306 has already been deposited and etched to mask and define the STI trench areas 402 and 404 or the STI trench area 402 and 404 edges or borders, the nitride layer 306 hard mask may be advantageously reused to define the periphery area STI trench 404. Additionally, as the nitride layer 306 defines a region between the pixel area STI trench 402 and the periphery area STI trench 404, a precision mask is not necessary because the second photoresist 502 does not define the edge features of the periphery area STI trench. Instead, the second photoresist 502 extends to the nitride layer 306 mask to cover the pixel area 102 structures while permitting the nitride layer 306 mask the periphery area STI 404 features. Thus, the pixel area 102 structures are protected from damage by later etching processes. Any acceptable sacrificial material, e.g., a polymer or an oxide, could be used in lieu of photoresist 502, as will be apparent to those skilled in the art.

In particularly useful embodiments, a mask from an earlier lithography step may be used to pattern the second photoresist 502, reducing the number of masks necessary to implement the presented principles. For example, a mask used in a periphery area 104 implant step may be suitable for patterning the photoresist 502. In such a step, a photoresist may be applied, and developed by exposing the photoresist through openings in the mask that would also be used to pattern a photoresist for implanting dopants in the periphery area.

Figure 6:
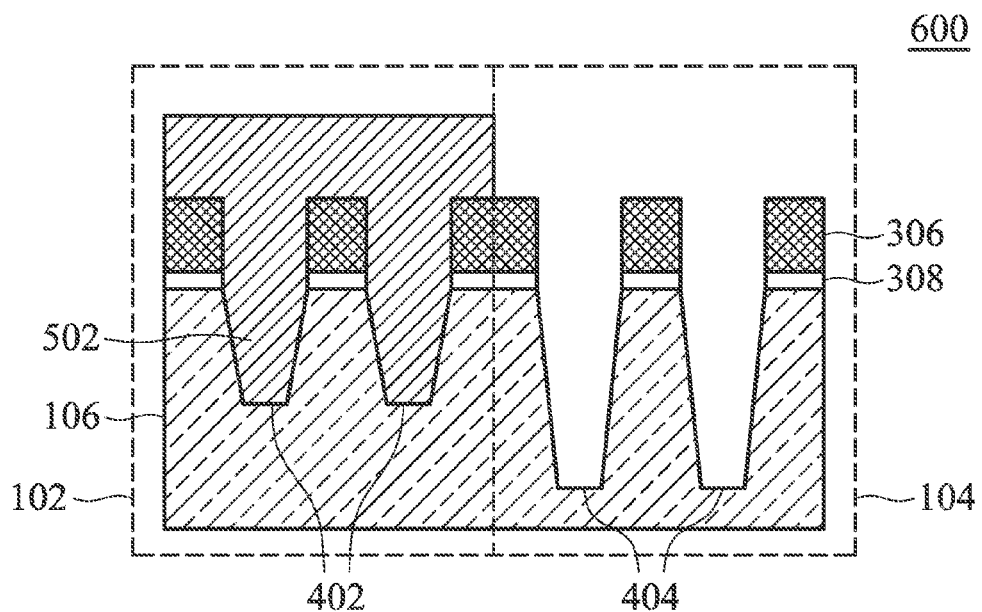

FIG. 6 illustrates a second STI etch step 600. In particularly useful embodiments, the periphery area STI trench 404 is etched a second time to bring it to its final depth, which will be greater than the original pixel area STI trench 402 depth. Similar to the first etching step 300, the second etching step 600 may advantageously be a plasma etch, or any other suitable etching process, such as, but not limited to, wet chemical etching, ion milling/sputter etching, reactive ion etching, or the like.

Figure 7:
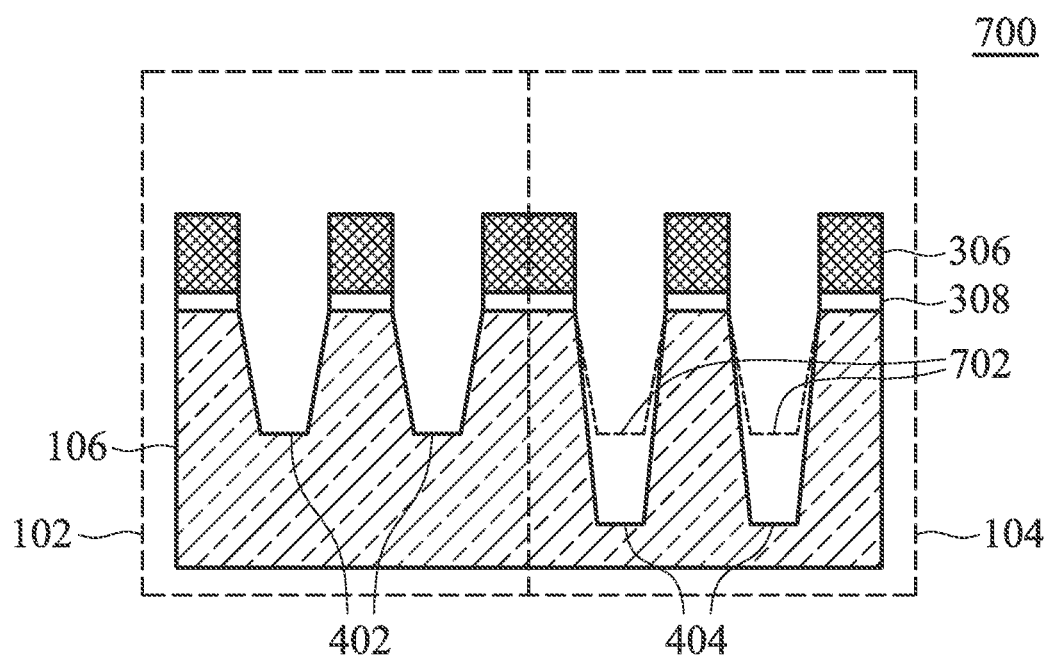

FIG. 7 illustrates the result of a final step in the dual profile STI creation process. The target structure is wet dipped a second time to remove any waste produced by the second plasma etch, and to remove the second photoresist 502. The resulting structure is a pixel area 102 with a pixel area STI trench 402 etched to a first depth 702, and a periphery area 104 with a periphery area STI trench 404 etched to a second depth greater than the periphery area first etch STI trench depth 702.

In order to provide a substantially flat surface for later fabrication steps, STI trenches are commonly filled with an insulating material, such as SiO2, or the like. The insulator may be deposited using chemical vapor deposition, or any other known or as yet undiscovered process. The deposited insulator is commonly machined via chemo-mechanical planarization after insulator deposition to bring the insulator flat with the remainder of the device surface.

While the present principles are described herein as being directed towards protecting a structure in the pixel area, skilled artisans will recognize that the principles described above can be used to reduce damage by any etching process, and at any step of a semiconductor fabrication process. For example, a dual profile plasma etch may be made when fabricating multiple devices with differing etching requirements.

In particularly useful embodiments, the STI trenches can be etched and filled at the beginning of the fabrication process before the first steps of device fabrication, or after initial doping, without deviating from the spirit and scope of the presented principles. However, the dual profile STI creation process may take place after the photodiode 112 and periphery structures have been fully or partially formed. For example, STI trenches may be etched and filled after the implant steps for the photodiode or periphery transistors, but prior to deposition of the metal interconnects or other layer of conductive material. Thus, the metal interconnects can be deposited on top of the insulator-filled STI trenches.

Although the present embodiments and their advantages have been described in detail, it should be understood that various changes, substitutions, and alterations can be made herein without departing from the spirit and scope of the disclosure as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device utilizing shallow trench isolation (STI), comprising:
   a semiconductor substrate having a first semiconductor device, a second semiconductor device and a third semiconductor device disposed thereon;
   an active area disposed on the semiconductor substrate, and having at least the first semiconductor device disposed therein;
   a periphery area disposed on the semiconductor substrate separate from the active area, and having at least the second semiconductor device disposed therein, the second semiconductor device connected to and controlling the first semiconductor device;
   a first STI trench bounding at least a portion of the active area, a portion of the first STI trench disposed between the first semiconductor device and the second semiconductor device, the first STI trench at least partially isolating the first semiconductor device from at least the second semiconductor device and third semiconductor device; and
   a second STI trench bounding at least a portion of the periphery area, a portion of the second STI trench disposed between the first semiconductor device and the second semiconductor device, wherein the second STI trench has a depth substantially deeper than the first STI trench and wherein the second STI trench isolates the second semiconductor device from at least the third semiconductor device.

2. The device of claim 1, wherein first semiconductor device is a photodiode.

3. The device of claim 2, wherein the second STI trench depth is at least about 140% the first STI trench depth.

4. The device of claim 1, wherein the first STI trench is between about 1400 angstroms and about 1600 angstroms deep, and wherein the second STI trench is between about 2300 angstroms and about 2600 angstroms deep.

5. The device of claim 1, wherein the ratio of the thickness of the semiconductor substrate to the depth of the first STI trench is about 1400:3 and the ratio of the thickness of the semiconductor substrate to the depth of the second STI trench is about 280:1.

6. The device of claim 1, wherein the device further comprises a nitride layer deposited on the semiconductor substrate and defining the first STI trench and second STI trench.

7. A semiconductor circuit device utilizing shallow trench isolation, comprising:
   a semiconductor substrate having at least one photodiode and at least one transistor disposed therein;
   an active area shallow trench isolation (STI) trench;
   an active area disposed on the semiconductor substrate and having borders defined by the active area STI trench, and having the at least one photodiode disposed therein, the active area STI trench surrounding the at least one photodiode;
   a periphery area STI trench;
   a periphery area disposed on the semiconductor substrate and having borders defined by the periphery area STI trench and having the at least one control transistor disposed therein, the periphery area STI trench surrounding the at least one control transistor, the at least one control transistor electrically connected to the at least one photodiode and controlling reading of the at least one photodiode; and
   a nitride layer defining the edges of the active area STI trench and the edges of the periphery area STI trench;
   wherein the periphery area STI trench is at least about 140% of the depth of the active area STI trench;
   wherein the active area STI trench and the periphery area STI trench have a first portion and second portion, respectively, the first portion and second portion extending between the at least one photodiode and the at least one control transistor, wherein the first portion and the second portion are spaced apart; and wherein the active area STI trench and periphery area STI trench are configured to at least partially electrically isolate the photodiode from the at least one control transistor.

8. The device of claim 7, wherein the active area STI trench is between about 1400 angstroms and about 1600 angstroms deep and wherein the periphery area STI trench is between about 2300 angstroms and about 2600 angstroms deep.

9. The device of claim 7, wherein the periphery area STI trench is at least about 167% of the depth of the active area STI trench.

10. The device of claim 7, wherein the active area STI trench is formed by a single plasma etching step and the periphery area STI trench is formed by the same plasma etching step as the active area STI trench and an additional, second plasma etching step.

11. The device of claim 7, wherein the photodiode has an average dark current of less than 7.5 electrons per second.

12. The device of claim 7, wherein more than one control transistor is disposed within the periphery area and are at least partially bounded by the periphery area STI trench.

13. A semiconductor device, comprising:
a semiconductor substrate having at least one semiconductor device and at least one transistor disposed therein;
an active area shallow trench isolation (STI) trench;
an active area disposed on the semiconductor substrate and having borders defined by the active area STI trench, and having the at least one semiconductor device disposed therein and surrounded by the active area STI trench;
a periphery area STI trench;
a periphery area disposed on the semiconductor substrate and having borders defined by the periphery area STI trench and having the at least one transistor disposed therein and surrounded by the periphery area STI trench, the at least one transistor electrically connected to the at least one semiconductor device and controlling the at least one semiconductor device; and
wherein the periphery area STI trench is at least about 140% of the depth of the active area STI trench; wherein the active area STI trench and the periphery area STI trench have a first portion and second portion, respectively, the first portion and second portion extending between the at least one photodiode and the at least one control transistor, wherein the first portion and the second portion are spaced apart and substantially parallel; and
wherein the active area STI trench and periphery area STI trench are configured to at least partially electrically isolate the at least one semiconductor device from the transistor.

14. The semiconductor device of claim 13, wherein the active area STI trench is between about 1400 angstroms and about 1600 angstroms deep and wherein the periphery area STI trench is between about 2300 angstroms and about 2600 angstroms deep.

15. The semiconductor device of claim 13, wherein the ratio of the thickness of the semiconductor substrate to the depth of the active area STI trench is about 1400:3 and the ratio of the thickness of the semiconductor substrate to the depth of the periphery area STI trench is about 280:1.

16. The semiconductor device of claim 13, further comprising a nitride layer deposited on the semiconductor substrate and defining the active area STI trench and periphery area STI trench.

17. The semiconductor device of claim 13, wherein a depth of the periphery area STI trench is at least about 167% of a depth of the active area STI trench.

18. The semiconductor device of claim 13, wherein the at least one semiconductor device is a photodiode, and wherein the at least one transistor is a row select transistor or a reset transistor.

19. The semiconductor device of claim 18, wherein the photodiode has an average dark current of less than 7.5 electrons per second.

20. The semiconductor device of claim 19, wherein more than one transistor is disposed within the periphery area and are at least partially bounded by the periphery area STI trench.

* * * * *